United States Patent [19]

Engle

[11] 4,289,598
[45] Sep. 15, 1981

[54] PLASMA REACTOR AND METHOD THEREFOR

[75] Inventor: Frank W. Engle, Pleasanton, Calif.

[73] Assignee: Technics, Inc., Alexandria, Va.

[21] Appl. No.: 152,688

[22] Filed: May 23, 1980

[51] Int. Cl.$^3$ .......................... C23C 15/00; C23F 1/00
[52] U.S. Cl. ................................ 204/192 E; 204/298; 156/345; 156/643
[58] Field of Search .......................... 204/192 E, 298; 156/345, 643; 250/531

[56] References Cited

U.S. PATENT DOCUMENTS

| 3,414,503 | 12/1968 | Brichard | 204/298 |
| 4,178,877 | 12/1979 | Kudo | 118/728 |
| 4,223,048 | 9/1980 | Engle, Jr. | 427/39 |
| 4,230,553 | 10/1980 | Bartlett et al. | 204/192 E |

FOREIGN PATENT DOCUMENTS

| 2116190 | 5/1973 | Fed. Rep. of Germany | 204/298 |
| 54-108579 | 8/1979 | Japan | 204/192 E |
| 1522059 | 8/1978 | United Kingdom | 204/298 |

*Primary Examiner*—Aaron Weisstuch

*Attorney, Agent, or Firm*—Berman, Aisenberg & Platt

[57] ABSTRACT

A plasma reactor includes a series of parallel disposed electrodes carried in a vacuum vessel chamber. The series of electrodes is adapted to have alternate polarities. Supporting brackets are provided for positioning workpieces, such as multilayer printed circuit boards, parallel to and between electrodes of alternate polarities. The supporting brackets are electrically isolated from the electrodes. Furthermore, a uniform gas flow is directed across the surfaces of the workpieces upon their being subjected to a gas discharge plasma, by providing the plasma reactor with a parabolically-shaped door defining a parabolic surface within the vacuum vessel chamber, as well as vertically disposed baffle plates and at least three radial gas inlets located equidistantly about said chamber. The radial gas inlets have discharge ends directed at the parabolic surface of the door and are located between the baffle plates and the parabolic door surface. Parallel arrangement of electrodes, as well as the elements utilized in directing a uniform gas flow, provide uniform conditioning of workpieces positioned within the gas discharge plasma of the plasma reactor.

19 Claims, 7 Drawing Figures

U.S. Patent  Sep. 15, 1981  Sheet 1 of 3  4,289,598
FIG. 1
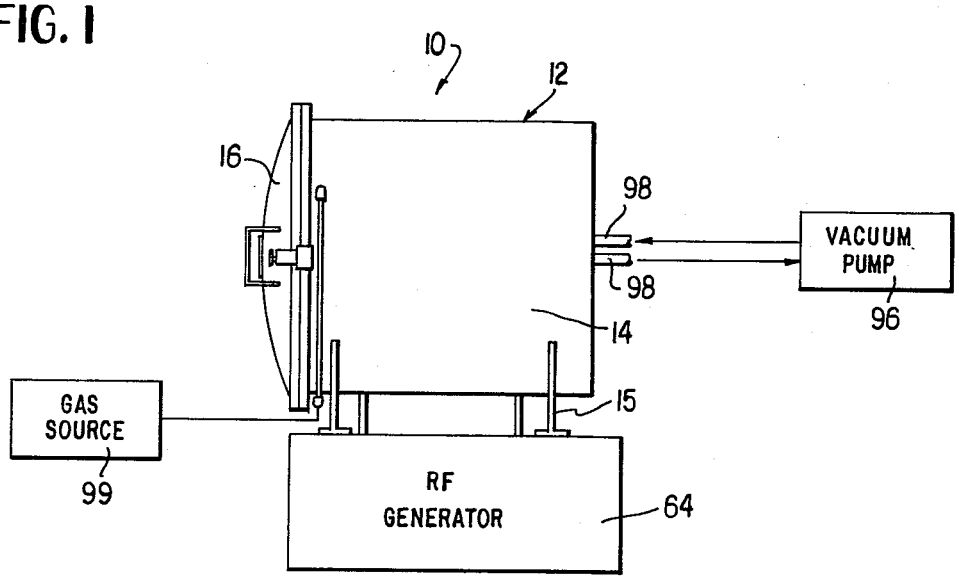
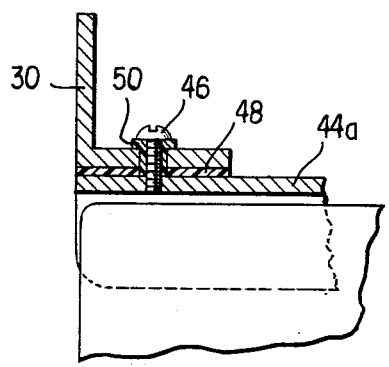
FIG. 4
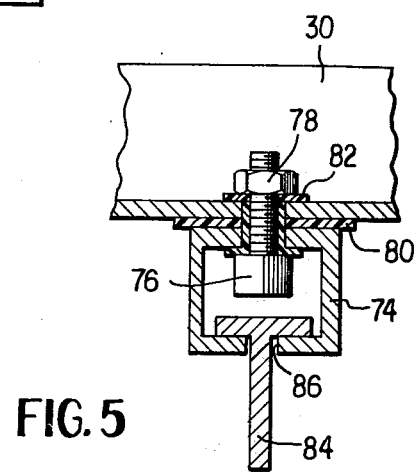
FIG. 5
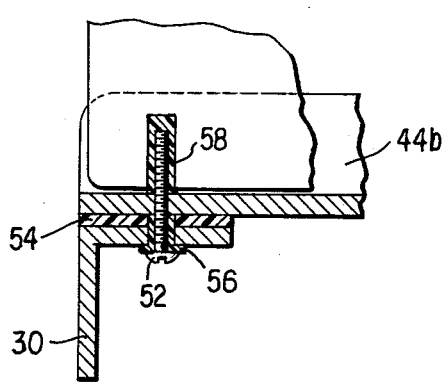
FIG. 6
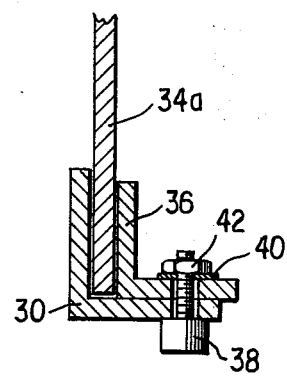
FIG. 7

PLASMA REACTOR AND METHOD THEREFOR

BACKGROUND OF THE INVENTION

The present invention relates to plasma reactors, and more particularly, to plasma reactors which uniformly condition workpieces treated by a gas discharge plasma within said reactor.

In the manufacture of multilayer printed circuit boards (either of the rigid or flexible variety), interconnecting holes are drilled through the boards and interconnecting metallic layers are plated within the drilled holes to provide an electrical connection between exposed edge portions of the conducting layers of the printed circuit boards. Typically, the printed circuit board's conducting layers are defined patterns of copper, separated by layers of insulating plastic.

A problem which has been encountered in forming interconnecting holes is commonly known as "drill smear" in the printed circuit board art. The drill smear problem is the result of resin from the board, as well as bonding agents that hold the boards together, coating the inside surface of the interconnecting holes. The resulting smeared layers tend to insulate the edge portions of the conducting layers exposed within the drilled holes, and if not removed prior to plating of the apertures, individual circuits will be shielded from the plating and, therefore, not function properly.

In the past the problem of drill smear was treated by either wet (acid) chemistry or dry (plasma) chemistry; however, each of these methods was plagued with numerous problems. A typical example of using the wet chemistry method to attack drill smear can be found in U.S. Pat. No. 4,155,775 to Alpaugh et al. Likewise, an example of utilizing dry chemistry to solve this problem can be found in U.S. Pat. No. 4,012,307 to Phillips.

In utilizing wet chemistry, corrosive chemicals are used to attack the smear and transform it into a residue that is then washed away with water, whereas in dry chemistry, a plasma is used to chemically convert the drill smear into gaseous by-products that are carried away by a mechanical pump.

In general, wet chemistry is considered the less desirable method since it creates undue hazards for personnel and excess pollutants both in the form of vapor and waste materials that are difficult to dispose of properly. Moreover, plasma de-smearing is a one-step operation as compared to the wet de-smearing operation which is multistep. Also, the dry chemistry method etches back the non-metallic portion of the multilayer printed circuit board adjacent to the conducting layers in the region of the drilled holes, thereby providing an increased exposed surface area of the conducting layers to which the interconnecting metallic layer is subsequently plated. Accordingly, improved mechanical adhesion of the interconnecting metallic layer results from the etching back operation.

While it is advantageous to use dry chemistry, certain difficulties and deficiencies have been encountered in prior art plasma reactors. In particular, the electrode and chamber design utilized in such plasma reactors are not compatible to large scale production systems. Furthermore, non-uniformity in workpiece conditioning has been encountered when utilizing large scale plasma reactor systems having annular-shaped electrodes.

Therefore, it is an object of the apparatus and method of the present invention to overcome the heretofore described deficiencies of the prior art.

A particular objective of the present invention is to provide uniformly conditioned workpieces treated in a plasma reactor apparatus suitable for large scale production operations.

These and other features and attendant advantages of the present invention will be more fully appreciated as the same become better understood from the following detailed description thereof.

SUMMARY OF THE INVENTION

The plasma reactor of the present invention is ideally suited for conditioning workpieces, such as multilayer printed circuit boards, in a gas discharge plasma. In particular, the conditioning of the printed circuit boards may include the de-smearing and etching back of interconnecting holes formed therein.

A vacuum vessel having a chamber therein is the plasma reactor housing. Within the chamber is supported a series of parallel disposed electrodes adapted to have alternate polarities. In addition, workpiece supporting means are provided for positioning each workpiece between adjacent electrodes of alternate polarities. The workpiece supporting means are disposed within the vacuum vessel chamber and are electrically isolated from the electrodes.

Means are further provided for directing a uniform flow of gas across the workpiece while the workpiece is conditioned in the gas discharge plasma. In particular, the uniform gas directing means include a vacuum vessel door defining a parabolic surface within the vacuum vessel chamber, vertically disposed baffle plates, and at least three radial gas inlets disposed equidistantly about the chamber. The radial gas inlets each have a discharge end which is directed at the parabolic surface of the vacuum vessel door and located between the baffle plates and the parabolic surface.

Parallel arrangement of the plasma reactor electrodes, as well as the uniform flow of the plasma gas across surfaces of the workpieces, provide for the uniform conditioning of workpieces disposed within the plasma reactor of the present invention.

In the method of the present invention utilizing the above-described plasma reactor, each workpiece is positioned parallel to and between a pair of adjacent electrodes of the series of electrodes. The adjacent electrodes are caused to have alternate polarities, and a gas discharge plasma is generated therebetween for conditioning of the workpiece.

BRIEF DESCRIPTION OF THE DRAWINGS

FIG. 1 is a side elevational view of the plasma reactor of the present invention.

FIG. 4 is a partially cross-sectional, exploded view of a top channel member used in the present invention, as shown along lines 4—4 of FIG. 2.

FIG. 5 is a partially cross-sectional, exploded view of means used in the present invention for carrying workpieces therein, as shown along lines 5—5 of FIG. 3.

FIG. 6 is a partially cross-sectional, exploded view of a bottom channel member used in the present invention, as shown along lines 6—6 of FIG. 2.

FIG. 7 is a partially cross-sectional, exploded view of an end electrode retainer member used in the present invention, as shown along lines 7—7 of FIG. 2.

DETAILED DESCRIPTION OF THE INVENTION

Figure 2:
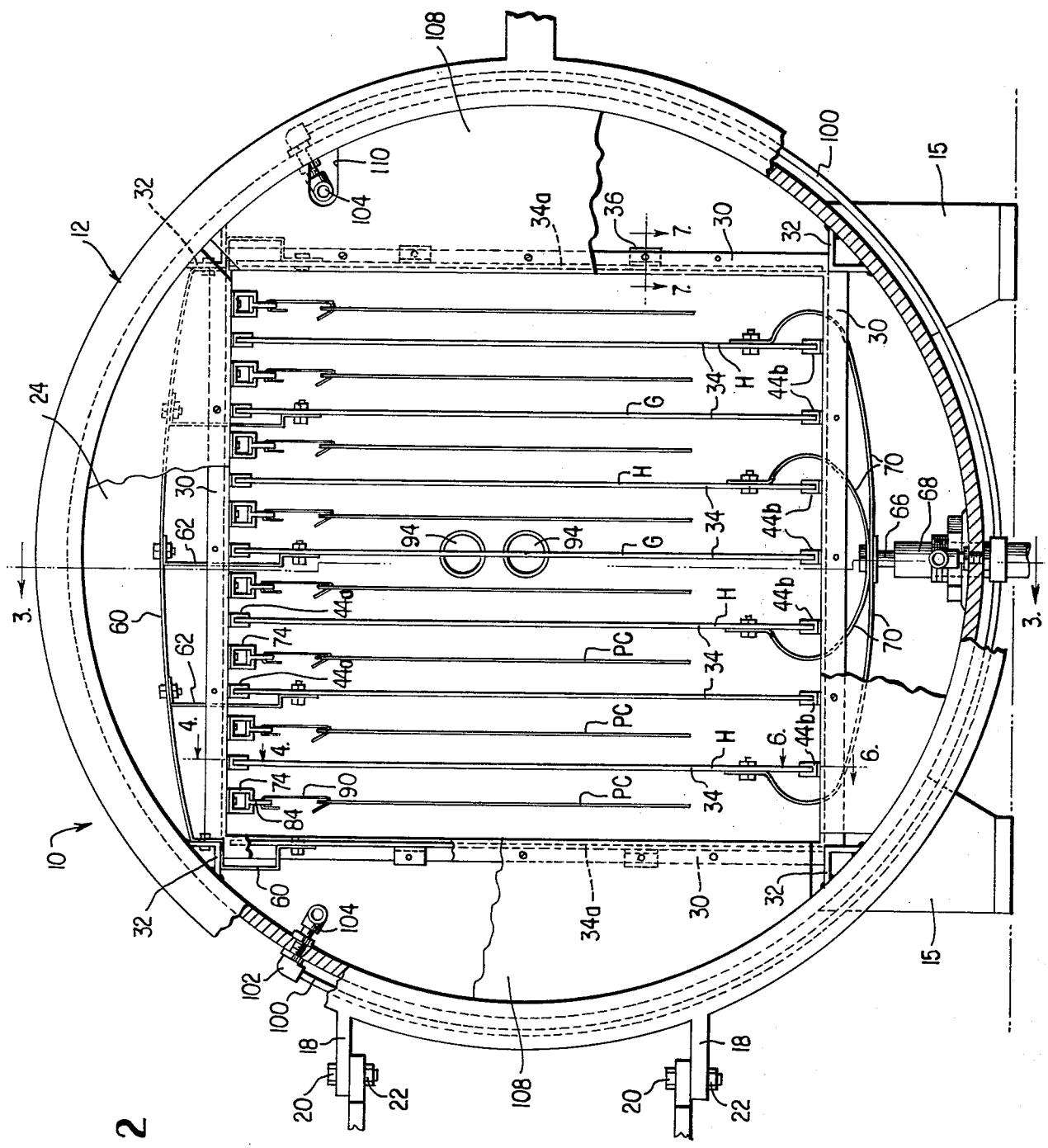
FIG. 2 is a partially cross-sectional, elevational view of the plasma reactor of FIG. 1.
Figure 3:
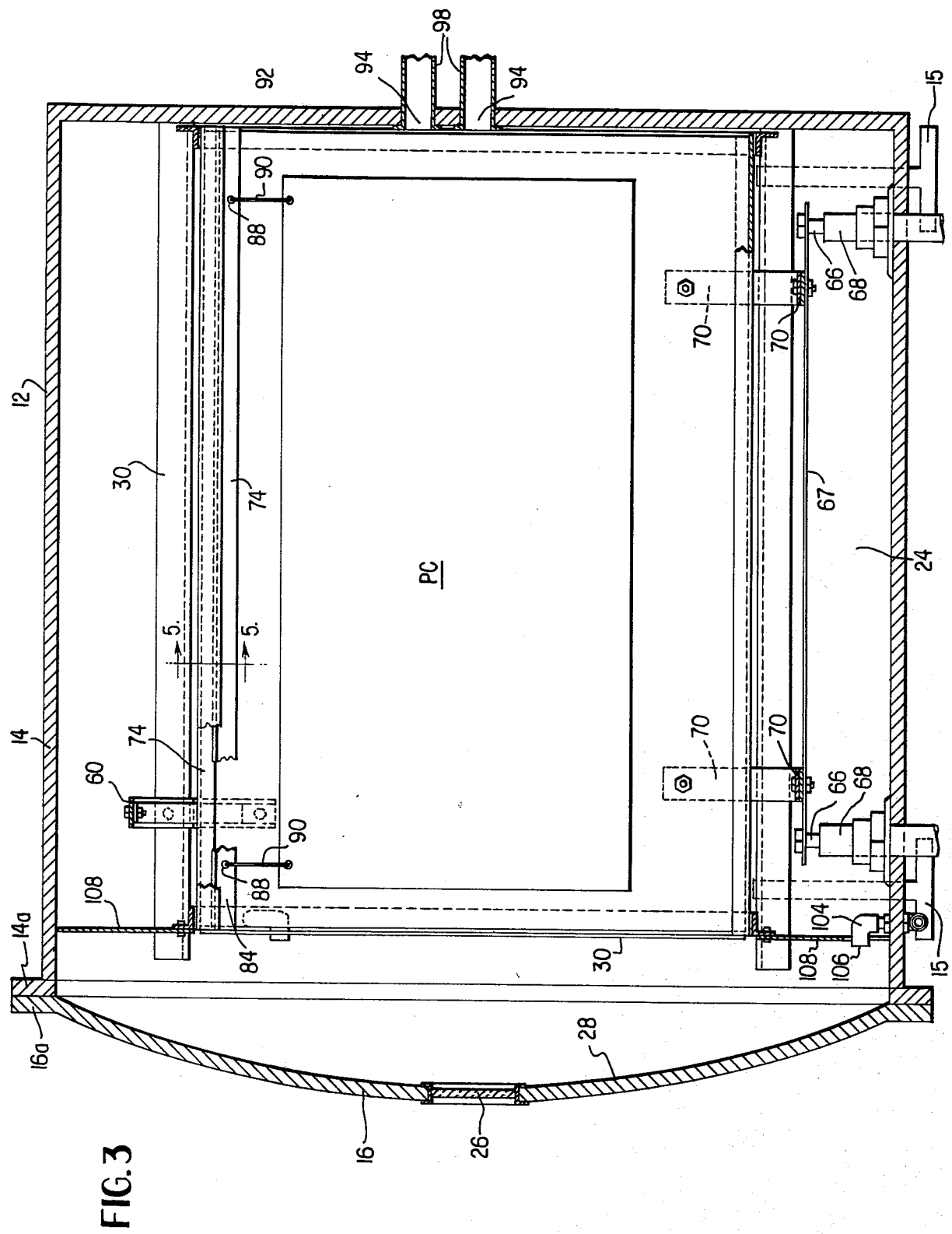
FIG. 3 is a partially cross-sectional view along lines 3—3 of FIG. 2.

Referring now to the drawings, wherein like reference numerals represent identical or corresponding parts throughout the several views, and more particularly to FIGS. 1, 2 and 3 thereof, the plasma reactor of the present invention is indicated generally by reference numeral 10. Plasma reactor 10 includes a vacuum vessel 12 having a generally cylindrically-shaped section 14 with a parabolically shaped door 16 hingedly mounted thereto at brackets 18 by means of nuts and bolts 20 and 22, respectively. Vaccum vessel 12 is supported on a work surface by legs 15 which are fixed to section 14. A chamber 24 is defined within vacuum vessel 12. Typically, vacuum vessel 12 is constructed of internally welded aluminum, and door 16 and cylindrical section 14 sealingly mate at flange members 14(a) and 16(a), respectively, so that when required an evacuated condition is maintained within the chamber 24.

Door 16 is provided with a viewing window 26 and further defines a parabolic surface 28 within the chamber 24.

In utilizing the present invention for production type operations, the vacuum vessel 12 may be, for example, 38 inches in diameter and 48 inches deep.

A box-like cage frame 30, constructed from angle rails, is carried by vacuum vessel 12 along support members 32 which extend longitudinally through cylindrical section 14 and are welded thereto. Support members 32 are themselves formed of angle rails. Teflon pads, not shown, are positioned between support members 32 and cage frame 30 to electrically isolate cage frame 30 from vacuum vessel 12.

Secured to cage frame 30 is a series of parallel, vertically disposed electrodes 34, including end electrodes 34(a). Each electrode is planar in structure and approximately 2 feet by 3 feet in dimensions. While electrodes 34 and 34(a) are depicted as being imperforate, it is nevertheless anticipated by the present invention that the electrodes may be perforated.

Whereas the rear wall of the vacuum vessel 12 is shown flat, it may appear parabolic in practice for purposes of structural integrity and improved pumping speed uniformity at the rear of the electrode cage 30.

Referring to FIGS. 2 and 7, end electrodes 34(a) abut cage frame 30 along their periphery and are held thereto by means of end electrode retainer members 36. Retainer members 36 are L-like in shape and are themselves secured to cage frame 30 by means of bolts 38, washers 40 and nuts 42. End electrodes 34(a) are electrically isolated by conventional insulation means (not shown) from retainer members 36 and cage frame 30.

Referring to FIGS. 2, 4 and 6, opposed pairs of top and bottom electrode support channel members 44(a) and 44(b), respectively, are used for positioning electrodes 34 along the cage frame 30. Each of the channel members 44(a) and 44(b) is U-like in configuration so that the electrodes 34 may be disposed within the groove, or channel, formed therein. With particular attention to FIG. 4, top channel members 44(a) are secured to cage frame 30 by means of screws 46; however, members 44(a) are electrically isolated from cage frame 30 by a Teflon insulation strip 48 disposed between frame 30 and channel member 44(a), and further by means of threading screw 46 through an electrically insulated shoulder bushing 50 as it extends through frame 30. Drawing attention to FIG. 6, bottom channel members 44(b) are secured to cage frame 30 by means of screws 52 and are electrically isolated from cage frame 30 by means of Teflon insulation strips 54 and electrically insulating shoulder bushings 56. It is significant to note that screws 52 are longer than screws 46, thereby extending into grooves 58 of electrodes 34. Accordingly, screws 52 in cooperation with grooves 58 assist in the proper alignment of electrodes 34.

End electrode retainer members 36 are positioned on cage frame 30 so as to allow for expansion and contraction of end electrodes 34(a) and thereby eliminate warping of the electrodes which could bring them out of parallel alignment with adjacent electrodes. Likewise, the grooves formed in top and bottom electrode channel members 44(a) and 44(b) are constructed to appropriate tolerances so that the electrodes retained therein do not warp out of parallel alignment because of electrode expansion and contraction.

The series of electrodes, which includes electrodes 34 and 34(a), is arranged in the present invention so that adjacent electrodes are of opposite polarities. For the purpose of describing the present invention, it is assumed that end electrodes 34(a), as well as electrodes 34 which are alternately positioned between electrodes 34(a) and referenced by the letter G, are maintained at ground potential by means of common grounding strap 60 and auxiliary grounding strap 62. Common strap 60 extends between and is bolted to the uppermost support members 32. Accordingly, common strap 60 is grounded by its electrical contact with vacuum vessel 12 via support members 32. Furthermore, common strap 60 extends downwardly at its ends and is bolted to each of the end electrodes 34(a). Auxiliary straps 62, extending in a generally vertical manner, have one end thereof bolted to common strap 60 and an opposite end thereof bolted to one of the electrodes 34 which is to be maintained at ground potential.

The remaining electrodes 34, those electrodes not at ground potential, are designated by the letter H and are maintained at a predetermined R.F. potential by electrical communication with R.F. generator 64, as shown in FIG. 1. Two R.F. feed-throughs 66, FIG. 3, are in electrical contact with R.F. generator 64, extend through the bottom of vacuum vessel 12 and are electrically isolated therefrom by insulation sleeves 68. A common conducting strap 67 extends between and is bolted to each R.F. feed-through. Strap members 70 are secured by bolts to common conducting strap 67 and extend therefrom to the alternately disposed electrodes 34 which are being maintained at a predetermined R.F. potential. Conducting straps 70 are fixed to their respective electrodes 34 by conventional bolting means. Therefore, the present invention provides parallel disposed pairs of adjacent electrodes of alternate polarity; i.e., ground potential and a predetermined R.F. potential.

While two R.F. feed-throughs 66 are shown in FIG. 3, it is nevertheless understood that the present invention can operate with only one R.F. feed-through.

Each workpiece to be conditioned in the plasma reactor 10, typically printed circuit boards designated PC in the figures, are disposed parallel to and between adjacent pairs of electrodes of alternate polarities. The means for so positioning the printed circuit boards include hollow-slotted bracket members 74, each of which is fixed to cage frame 30 between adjacent top channel members 44(a) as it extends longitudinally along vacuum vessel 12. Bracket members 74 are secured to cage frame 30 by means of nuts and bolts 76 and 78, respectively, as shown in FIG. 5. To assure that the printed circuit boards are not part of the electrical circuitry of the present invention, Teflon insulating strips 80 are disposed between bracket members 74 and cage frame 30. Moreover, nuts 78 and bolts 76 are electrically isolated from bracket members 74 and cage frame 30 by electrical insulating shoulder bushings 82.

T-rails 84 are supported within bracket members 74 and extend through slots 86 thereof. Apertures 88, as shown in FIG. 3, are formed in T-rails 84 to receive one hooked end of suspension members 90. The opposite hooked ends of suspension members 90 are received within openings in the printed circuit board, whereby two or more suspension members 90 support the board in a substantially parallel relationship between two adjacent electrodes.

It is understood that the suspension member 90 can take other conventional forms than that described above, such as alligator clips or the like.

A rear wall of vacuum vessel 12 is designated by the numeral 92 and includes two exit ports 94 in communication with a vacuum pump 96 by means of conduits 98. The atmosphere in the vacuum vessel chamber 24 is evacuated through ports 94 by activation of vacuum pump 96. While two evacuation ports 94 are described, it is nevertheless anticipated that only one exit port 94 is needed in the operation of the present invention.

The gas or gas mixture which is ignited into a gas discharge plasma in chamber 24 is provided by an external gas source 99. Gas from source 99 flows through conduit pipes 100, which are secured to vacuum vessel 12 by conventional conduit fixtures 102, and exits into chamber 24 from three radial gas inlets 104 equidistantly positioned about vacuum vessel 12. Radial gas inlets 104 are elbowed and positioned forwardly in cylindrical section 14 so that the gas exiting from their discharge ends 106 is directed towards parabolic surface 28 of closed door 16. Moreover, vertically disposed baffle plates 108 are fastened by conventional means to cage frame 30 in a forward position in cylindrical section 14 and extend from cage frame 30 to the interior surface of vacuum vessel 12. At least the discharge ends 106 of each radial gas inlet 104 extend through openings 110 in baffle plates 108 so that discharge ends 106 are positioned between baffle plates 108 and parabolic surface 28. The equidistant positioning of inlets 104, the directing of the discharge gas toward parabolic surface 28, and the baffle plates 108 provide for a uniform flow of the gas across the surfaces of the circuit boards upon the generation of a gas discharge plasma.

In a typical operation of the present invention, the printed circuit boards to be conditioned, i.e., desmeared and etched back, are disposed within chamber 24 between adjacent electrodes. Door 16 is secured in its closed position and chamber 24 is evacuated to a pressure of approximately 50 millitorr by means of vacuum pump 96. Vacuum pump 96 is preferably of a type which is capable of at least 120 cfm operation. Upon evacuation of chamber 34, a gas mixture, typically oxygen and freon in ratios of 7 to 3 or 8 to 2, is pumped into chamber 24 to bring the relative chamber pressure up to approximately 250 millitorr. The R.F. generator 64, capable of operating in a frequency range of 30 to 60 KHz with a power potential of 4800 watts, is activated to establish a predetermined R.F. potential at alternately positioned electrodes 34 having been designated by the letter H in FIG. 2; end electrodes 34(a) and those electrodes 34 designated by the letter G are, of course, maintained at ground potential. Once the electrodes in communication with R.F. generator 64 have reached their appropriate polarity potential, the gas mixture is ignited into a discharge plasma liberating free atomic oxygen and free fluorine for the purpose of removing drill smear and the etching back of non-metallic material of the multilayer printed circuit boards.

The parallel arrangement and close proximity of the electrodes to the printed circuit boards have resulted in a shortening of the conditioning cycle time, since the gases which are ignited in the plasma do not have to diffuse great distances in order to condition the printed circuit boards. Moreover, since each printed circuit board is positioned between a pair of adjacent electrodes and the plasma is struck along a surface approximately parallel to that of the printed circuit board itself, improved batch uniformity across each circuit board and from circuit board to circuit board is realized.

It has been found that the operation of the subject invention is also useful in the pretreatment of laminate panels for the purpose of improving their bondability with laminating adhesives. In pretreating applications, the apparatus and method of the present invention are similar to that discussed above, although the process time and power requirements are substantially less.

Accordingly, the present invention provides a much sought after improvement in the plasma art, whereby large scale production and uniform conditioning of workpieces, such as multilayer circuit boards, are readily obtainable.

While the invention has been described with respect to a specific embodiment, it is not limited thereto. The appended claims therefore are intended to be construed to encompass all forms and embodiments of the invention, within its true and full scope, whether or not such forms and embodiments are expressed therein.

What is claimed is:

1. A plasma reactor suitable for conditioning workpieces in a gas discharge plasma, comprising:
   a vacuum vessel having a chamber therein;
   a series of parallel disposed electrodes supported in said vacuum vessel chamber, said series of electrodes adapted to have alternate polarities; and
   means for supporting workpieces to be conditioned in said plasma reactor between adjacent electrodes of said series of electrodes, said supporting means disposed in said vacuum vessel chamber and electrically isolated from said electrodes.

2. The plasma reactor according to claim 1 wherein said electrodes are planar in configuration.

3. The planar reactor according to claims 1 or 2 wherein said electrodes are perforated.

4. The planar reactor according to claims 1 or 2 wherein said electrodes are imperforate.

5. The plasma reactor according to claims 1 or 2 wherein said alternate polarities are ground potential and a predetermined R.F. potential.

6. The plasma reactor according to claim 1, further including:
   means for supporting said electrodes, said electrode supporting means adapted to accommodate expansion or contraction of said electrodes, thereby inhibiting electrode warping.

7. The plasma reactor according to claim 6 further comprising:
   cage frame means supported in said vacuum vessel and electrically insulated therefrom, said cage frame means carrying said series of electrodes and said means for supporting workpieces.

8. The plasma reactor according to claim 7 further comprising:
   means for electrically isolating said series of electrodes from said cage frame means.

9. The plasma reactor according to claim 7 wherein said electrode supporting means comprises at least two oppositely disposed channel brackets for supporting each of said electrodes, said channel brackets being secured to said cage frame means.

10. The plasma reactor according to claim 1 wherein said workpiece supporting means for supporting each workpiece comprises:
    a slotted bracket having a support member carried therein and extending through a slot of said bracket, and
    means engaging and extending from said support member for holding a workpiece between and parallel to adjacent electrodes.

11. The plasma reactor according to claim 10 wherein said support member is a T-rail.

12. The plasma reactor according to claim 10 further comprising:
    cage frame means supported in said vacuum vessel and electrically insulated therefrom, said slotted bracket fixed to said cage frame.

13. The plasma reactor according to claim 1 further comprising:
    means for directing a uniform flow of gas across the workpiece when the workpiece is being conditioned in a gas discharge plasma.

14. The plasma reactor according to claim 13 wherein said means for directing a uniform gas flow comprises:
    said vacuum vessel having a door defining a parabolic surface in said chamber;
    vertically disposed baffle plates positioned within said chamber; and
    a plurality of radial gas inlets disposed equidistantly about said chamber, said radial gas inlets having discharge ends directed at the parabolic surface of said door and located between said baffle plates and said parabolic surface.

15. The plasma reactor according to claim 14 having at least three radial gas inlets.

16. The plasma reactor according to claim 14 wherein said vacuum vessel door is parabolically-shaped.

17. A plasma reactor system suitable for conditioning workpieces in a gas discharge plasma, comprising:
    a vacuum vessel having a chamber therein;
    a series of parallel disposed electrodes supported in said vacuum vessel chamber, said series of electrodes adapted to have alternate polarities; and
    means for supporting workpieces to be conditioned in said plasma reactor between adjacent electrodes of said series of electrodes, said supporting means disposed in said vacuum vessel chamber and electrically isolated from said electrodes;
    a vacuum pump means in communication with said vacuum vessel chamber for evacuating said chamber;
    a gas source means in communication with said vacuum vessel chamber; and
    an R.F. generator means in electrical contact with alternately positioned electrodes.

18. In the method of conditioning workpieces in a gas discharge plasma utilizing a plasma reactor having a vacuum vessel with a chamber therein and a series of parallel disposed electrodes supported in said chamber, the steps comprising:
    disposing each workpiece between a pair of adjacent electrodes of said series of electrodes and electrically isolated therefrom;
    causing said series of electrodes to be of alternate polarities; and
    generating a gas discharge plasma in said chamber.

19. The method according to claim 18 comprising the further step of:
    causing a plasma gas to flow uniformly across the surfaces of said workpieces.

* * * * *